(12) United States Patent  (10) Patent No.: US 8,144,741 B2
Takagi  (45) Date of Patent: Mar. 27, 2012

(54) SEMICONDUCTOR LASER

(75) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 12/823,172

(22) Filed: Jun. 25, 2010

(65) Prior Publication Data

US 2010/0260225 A1    Oct. 14, 2010

Related U.S. Application Data

(62) Division of application No. 12/131,955, filed on Jun. 3, 2008, now Pat. No. 7,773,651, which is a division of application No. 11/530,968, filed on Sep. 12, 2006, now Pat. No. 7,397,833.

(30) Foreign Application Priority Data

May 18, 2006    (JP) .................................. 2006-138556

(51) Int. Cl.
*H01S 5/00* (2006.01)
(52) U.S. Cl. ................ 372/45.01; 372/43.01; 372/50.11; 372/64
(58) Field of Classification Search ............... 372/43.01, 372/45.01, 50.11
See application file for complete search history.

(56) References Cited

U.S. PATENT DOCUMENTS

| | | | |
|---|---|---|---|
| 4,847,844 A | 7/1989 | Noda et al. | |
| 4,896,331 A | 1/1990 | Hirata | |
| 4,993,036 A | 2/1991 | Ikeda et al. | |
| 5,321,716 A * | 6/1994 | Kinoshita et al. | 372/96 |
| 5,504,768 A * | 4/1996 | Park et al. | 438/39 |
| 5,844,931 A | 12/1998 | Sagawa et al. | |
| 6,999,485 B2 | 2/2006 | Takagi | |
| 2002/0141467 A1 | 10/2002 | Iwai et al. | |
| 2003/0147617 A1 * | 8/2003 | Park et al. | 385/131 |

FOREIGN PATENT DOCUMENTS

| | | |
|---|---|---|
| JP | 11-220220 A | 8/1999 |
| JP | 2000-357842 A | 12/2000 |
| JP | 2002-299759 A | 10/2002 |
| JP | 2003-304035 A | 10/2003 |
| JP | 2005-302843 A | 10/2005 |

* cited by examiner

*Primary Examiner* — Dung Nguyen
(74) *Attorney, Agent, or Firm* — Leydig, Voit & Mayer, Ltd.

(57) ABSTRACT

A semiconductor laser comprises: a substrate; an n-cladding layer disposed on the substrate; an active layer disposed on the n-cladding layer; a p-cladding layer disposed on the active layer and forming a waveguide ridge; and a diffraction grating layer disposed between the active layer and the n-cladding layer or the p-cladding layer and including a phase shift structure in a part of the diffraction grating layer in an optical waveguide direction. The width of the p-cladding layer is increased in a portion corresponding to the phase shift structure of the diffraction grating layer.

1 Claim, 8 Drawing Sheets

SEMICONDUCTOR LASER

BACKGROUND OF THE INVENTION

1. Field of the Invention

The present invention relates to a semiconductor laser, and more particularly to a distributed feedback semiconductor laser used as a light source for optical fiber communications, etc.

2. Description of the Related Art

In recent years, as broadband communications and public telecommunication networks using optical fibers have become widely used, there has been an increasing need to transmit a large amount of information at low cost. To meet such a need, it is necessary to increase the amount of information that can be transmitted per unit time, that is, to increase the information transmission rate. Actually, the transmission rate has been progressively increased from 600 Mbps to 2.5 Gbps, to 10 Gbps.

Such an increase in the transmission rate of optical communications devices has led to an expansion in the market for optical communications networks for use not only in trunk systems but in access systems (offices, homes), requiring that the optical transceivers employ high-speed, high-efficiency, yet low-cost light emitting/receiving devices.

Semiconductor lasers externally modulated by an optical modulator have been conventionally used as semiconductor lasers for optical communications. However, when the transmitters and receivers are separated by a relatively small distance, as in access systems, directly modulated semiconductor lasers may be used, since they have a simple configuration and hence can be produced at low cost.

Waveguide ridge type distributed feedback laser diodes, buried heterostructure distributed feedback laser diodes, etc. are used as directly modulated semiconductor lasers. (A distributed feedback semiconductor laser diode is hereinafter referred to as a DFB-LD.)

One known waveguide ridge type semiconductor laser is formed of a Group III-V nitride semiconductor material and has a Fabry-Perot ridge stripe structure. This semiconductor laser has a problem in that if the carrier density of the active layer is increased to achieve high output power, the density varies in a lateral direction, these causing hole burning and kinking and hence limiting high-power operation.

To prevent this, a semiconductor laser has been disclosed in which: the resonator is divided into two portions by a line perpendicular to the length direction of the resonator; and the optical confinement factor of the active layer under the ridge stripe structure is lower on the front end face side than on the rear end face side.

In this example, the front end face side includes a p-type $Al_{0.05}Ga_{0.95}N$ cladding layer, while the rear end face side includes a p-type $Al_{0.07}Ga_{0.93}N$ cladding layer. The p-type $Al_{0.05}Ga_{0.95}N$ cladding layer has a higher refractive index than the p-type $Al_{0.07}Ga_{0.93}N$ cladding layer. (See, e.g., paragraphs [0003], [0041], and [0044] and FIGS. 1 to 3 of Japanese Patent Laid-Open No. 2005-302843.)

Another known waveguide ridge type semiconductor laser is also formed of a Group III-V nitride semiconductor material and has a Fabry-Perot ridge stripe structure. In order to prevent formation of high-order horizontal transverse modes and occurrence of kinks as well as preventing degradation in laser characteristics, this semiconductor laser is formed such that the ridge portion includes two taper regions each tapering inwardly from a center portion of the resonator to a respective end of the resonator in the length direction, that is, the width of each taper region is reduced as a respective end of the resonator is approached. (See, e.g., paragraphs [0013], [0024], and [0025] and FIG. 1 of Japanese Patent Laid-Open No. 2000-357842.)

Further, one known buried heterostructure semiconductor laser device is constructed such that a Fabry-Perot semiconductor light-emitting element and a fiber grating form a resonator. This semiconductor laser device has a problem in that the distance between the fiber grating and the semiconductor light-emitting element is large, resulting in increased relative intensity noise due to resonance between the fiber grating and the light reflective film. This makes it difficult to achieve stable Raman amplification. To address this problem, a semiconductor laser device has been disclosed in which: an output side reflective film having a low light reflectance (1% or less) is formed on the light emitting end face; a reflective film having a high reflectance (70% or more) is formed on the light reflecting end face or the opposite end face; and the mesa stripe portion including an SCH-MQW active layer has a tapered shape, specifically, the portion of the mesa near the emitting side reflective film has a small width and the portion of the mesa near the high reflectance reflective film has a large width. This configuration allows the semiconductor laser device to generate laser light including two or more oscillation longitudinal modes. (See, e.g., paragraphs [0007] to [0009], [0033], and [0034] and FIG. 1 of Japanese Patent Laid-Open No. 2002-299759.)

Further, another known buried heterostructure semiconductor laser device has been proposed to increase the coupling efficiency between the semiconductor light-emitting element and the optical fiber. In order to emit light having a single-peaked pattern at a narrow emission angle without degrading operating characteristics such as the threshold current and slope efficiency, this semiconductor laser device is formed such that: the stripe-shaped active layer for generating laser light has continuously changing width throughout substantially the entire resonator region; and the width W1 of the active layer at the laser light emitting front end face and the width W2 of the active layer at the rear end face on the opposite side satisfy the relation: W2>W1. (See, e.g., paragraphs [0009], [0010], and [0017] and FIG. 2 of Japanese Patent Laid-Open No. 11-220220.)

In all conventional DFB lasers, whether waveguide ridge type or buried heterostructure type, the photon density distribution within the resonator is not uniform in the axial direction of the resonator or the optical waveguide direction.

In the case of a semiconductor laser with a diffraction grating having a phase shift structure, for example, the photon density distribution within the resonator is such that the photon density gradually increases from both end faces in the axial direction of the resonator toward the phase shift region and then dramatically increases to its maximum value within the phase shift region. In a semiconductor laser with a diffraction grating having no phase shift structure; on the other hand, the photon density may gradually increase from the emitting end face of the resonator toward the rear end face and then may dramatically increase at the rear end face portion, depending on the "end face phase".

Incidentally, the relaxation oscillation frequency fr of a semiconductor laser, which represents the high speed response characteristics of the laser, is proportional to the square root of the product of the photon density S and the optical confinement factor G. In a conventional DFB-LD, since the optical confinement factor G is constant in the axial direction of the resonator, the distribution of the relaxation oscillation frequency fr in the axial direction of the resonator is substantially the same as the photon density distribution. As a result, the response speed within the resonator varies in the axial direction, that is, the resonator has a non-uniform response speed distribution in the axial direction.

Specifically, the response speed is high in a high photon density region and low in a low photon density region. Therefore, when a semiconductor laser having a non-uniform photon density distribution is subjected to direct modulation operation at high speed (e.g., 10 Gbps), the problem of distortion of the modulated light waveform, etc. arises.

SUMMARY OF THE INVENTION

The present invention has been made to solve the above problems. It is a first object of the present invention to construct a semiconductor laser adapted such that the relaxation oscillation frequency does not vary much in the axial direction of the resonator even if the photon density distribution within the resonator is not uniform in the axial direction, allowing the semiconductor laser to achieve good high-speed response characteristics.

According to one aspect of the invention, there is provided a semiconductor laser according to the present invention comprises: a semiconductor substrate of a first conductive type; a first cladding layer of the first conductive type located on the semiconductor substrate; an active layer located on the first cladding layer; a second cladding layer of a second conductive type located on the active layer; and a diffraction grating layer located between the active layer and the first or second cladding layer and including a phase shift structure which is formed in a part of the diffraction grating layer in an optical waveguide direction, wherein an optical confinement factor is reduced in corresponding to the phase shift structure of the diffraction grating layer.

Accordingly, in the semiconductor laser according to the present invention, the optical confinement factor is reduced in a specific portion corresponding to the phase shift structure of the diffraction grating layer in such a way that the product of the photon density and the optical confinement factor in this specific portion is substantially equal to that in the other portions. As a result, the relaxation oscillation frequency in this specific portion corresponding to the phase shift structure is also substantially equal to that in the other portions. This means that the relaxation oscillation frequency does not vary much in the axial direction of the resonator, preventing distortion of the modulated light waveform and allowing the semiconductor laser to achieve good high-speed response characteristics.

According to another aspect of the invention, there is provided a semiconductor laser according to the present invention comprises: a semiconductor substrate of a first conductive type; a first cladding layer of the first conductive type located on the semiconductor substrate;
an active layer located on the first cladding layer; a second cladding layer of a second conductive type located on the active layer; and a diffraction grating layer located between the active layer and the first or second cladding layer, wherein a layer having a higher refractive index than the first or second cladding layer and located between said first and second cladding layers, is reduced in the thickness at one end having a higher photon density in an optical waveguide direction than at the other end.

Accordingly, in the semiconductor laser according to the present invention, reducing the thickness of the high refractive index layer results in a reduction in the optical confinement factor, making it possible to prevent the relaxation oscillation frequency from varying in the axial direction of the resonator. Therefore, when the semiconductor laser is subjected to direct modulation operation at high speed, it is possible to reduce the distortion of the modulated light waveform due to a change in the relaxation oscillation frequency or due to non-uniform relaxation oscillation frequency distribution within the resonator.

According to still another aspect of the invention, there is provided a semiconductor laser according to the present invention comprises: a semiconductor substrate of a first conductive type; a first cladding layer of the first conductive type located on the semiconductor substrate; an active layer located on the first cladding layer; a second cladding layer of a second conductive type located on the active layer; a diffraction grating layer located between the active layer and the first or second cladding layer; and an optical waveguide ridge including the a second cladding layer, wherein the waveguide ridge is larger in the width at one end having a higher photon density in an optical waveguide direction than at the other end.

Accordingly, in the semiconductor laser according to the present invention, the change in the relaxation oscillation frequency within the resonator reduces in the axial direction. Therefore, when the semiconductor laser is subjected to direct modulation operation at high speed, it is possible to reduce the distortion of the modulated light waveform due to a change in the relaxation oscillation frequency or due to non-uniform relaxation oscillation frequency distribution within the resonator.

According to yet another aspect of the invention, there is provided a semiconductor laser according to the present invention comprises: a semiconductor substrate of a first conductive type; a first cladding layer of the first conductive type located on the semiconductor substrate; an active layer located on the first cladding layer; a second cladding layer of a second conductive type located on the active layer; and a diffraction grating layer located between the active layer and said first or second cladding layer, wherein the pitch of the diffraction grating layer is varied in an axial direction of the resonator such that the product of the pitch and an equivalent refractive index is substantially constant in the axial direction, the equivalent refractive index being determined by the refractive index of each layer.

Accordingly, in the semiconductor laser according to the present invention, a variation in the oscillation wavelength A reduces, the semiconductor laser is allowed to emit laser light with a narrow spectral width predominantly including the desired oscillation wavelength.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
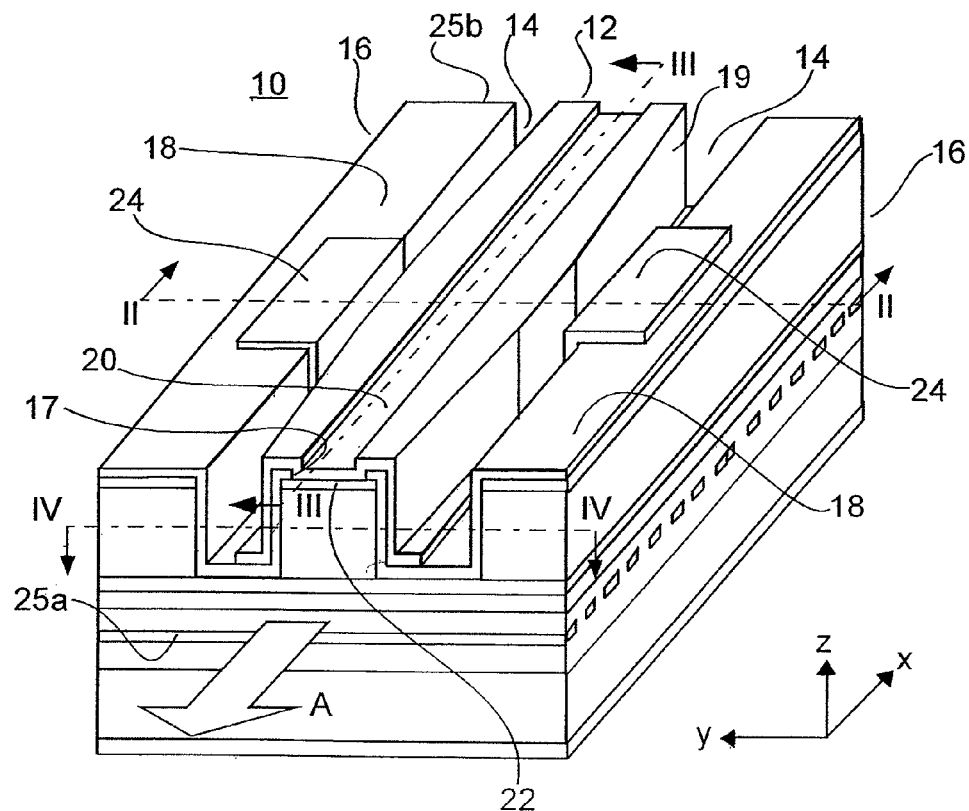
FIG. 1 is a perspective view of a semiconductor laser according to one embodiment of the present invention.
Figure 2:
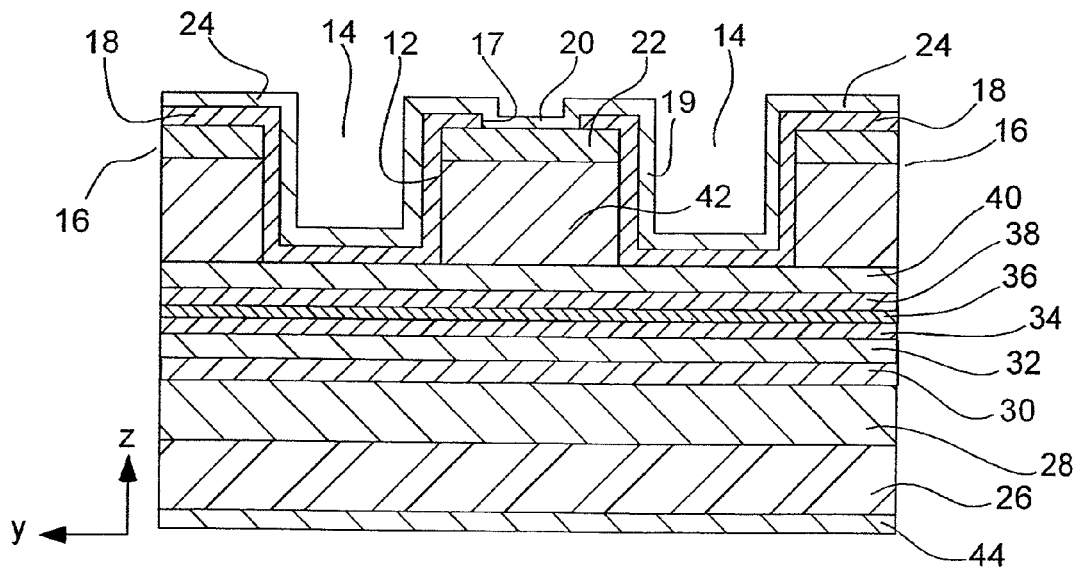
FIG. 2 is a cross-sectional view of the semiconductor laser taken along line II-II of FIG. 1.
Figure 3:
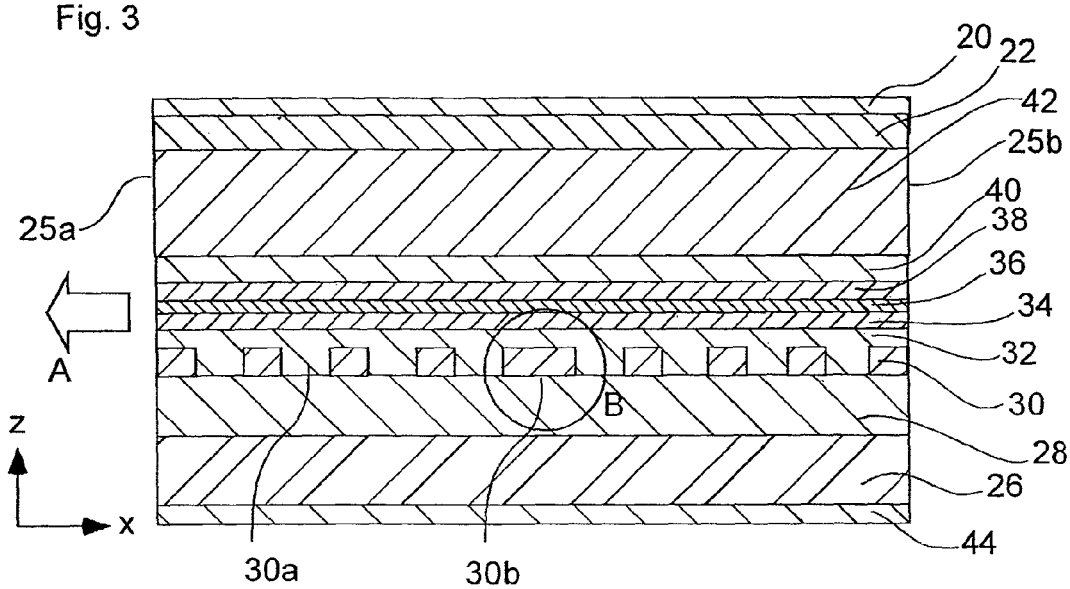
FIG. 3 is a cross-sectional view of the semiconductor laser taken along line III-III of FIG. 1.
Figure 4:
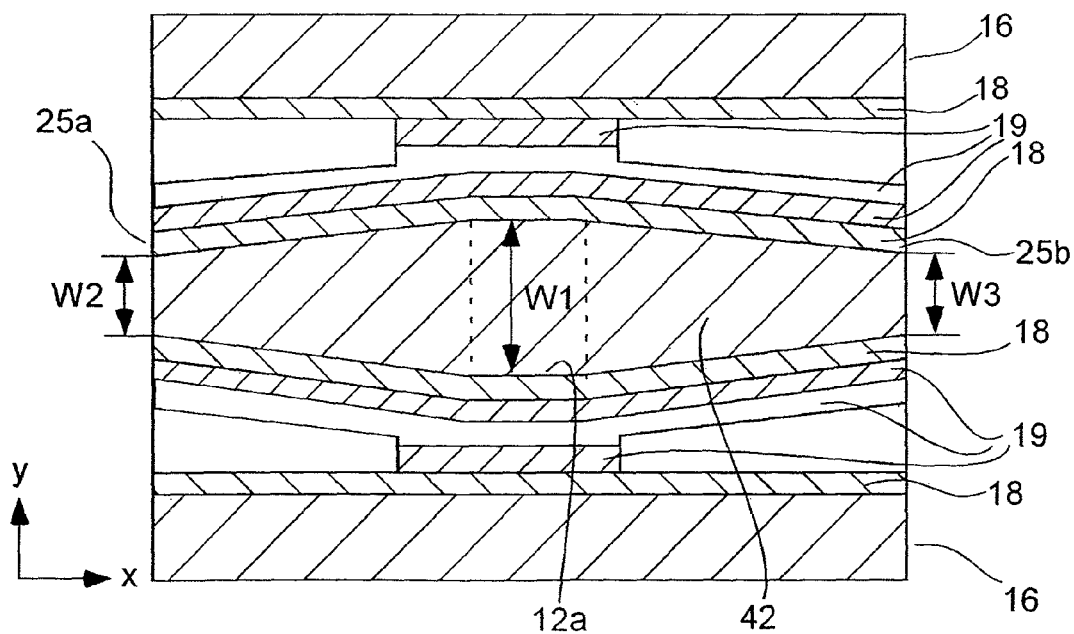
FIG. 4 is a cross-sectional view of the semiconductor laser taken along line IV-IV of FIG. 1.

FIG. 1 is a perspective view of a semiconductor laser according to one embodiment of the present invention; FIG. 2 is a cross-sectional view of the semiconductor laser taken along line II-II of FIG. 1; FIG. 3 is a cross-sectional view of the semiconductor laser taken along line III-III of FIG. 1; and FIG. 4 is a cross-sectional view of the semiconductor laser taken along line IV-IV of FIG. 1. It should be noted that in these figures, like numerals are used to denote like or corresponding components.

Referring to FIG. 1, the semiconductor laser of the present embodiment is a waveguide ridge type DFB-LD 10 having an oscillation wavelength of 1.3 µm and a resonator length L of approximately 100-250 µm, for example.

A waveguide ridge 12 at the center portion of the DFB-LD 10 extends in the laser light emission direction. Two electrode pad bases 16 are disposed on respective sides of the waveguide ridge 12. A separation groove 14 is disposed between each electrode pad base 16 and the waveguide ridge 12.

An insulating film, for example, an $SiO_2$ film 18 is disposed on the entire surface of the DFB-LD 10 other than the surfaces of an opening 17 provided at the center of the top portion of the waveguide ridge 12. The opening 17 is formed at the center of the top portion of the waveguide ridge 12 such that it extends in the axial direction of the resonator, or the x-direction.

Further, on the portion of the $SiO_2$ film 18 on the waveguide ridge 12 is disposed a 1 µm thick metal film 19 formed of, for example, a Ti layer, a Pt layer, and an Au layer. At the top portion of the waveguide ridge 12, the metal film 19 is in contact with a contact layer 22 or the top layer of the waveguide ridge 12 through the opening 17 as a p-electrode 20. A portion of the metal film 19 extends onto the electrode pad bases 16 on both sides of the waveguide ridge 12. The above extended portion on the $SiO_2$ film 18 on each electrode pad base 16 constitutes a bonding pad 24 for connecting between the p-electrode 20 and an external wire (not shown).

In FIG. 1, arrow A represents laser light, and the direction of arrow A is the emission direction of the light. In FIG. 1, reference numeral 25a denotes the emitting end face of the DFB-LD 10 through which laser light is emitted, and reference numeral 25b denotes the rear end face on the side opposite to the emitting end face 25a.

Referring now to FIG. 2, in the DFB-LD 10, an n-type cladding layer 28 is disposed on a substrate 26, and a diffraction grating layer 30 is disposed on the cladding layer 28. The substrate 26 is formed of n-type InP and has a carrier concentration of $5 \times 10^{18}$ cm$^{-3}$ and a thickness of 100 µm; the cladding layer 28 is formed of n-type InP and has a carrier concentration of $1 \times 10^{18}$ cm$^{-3}$ and a thickness of 0.3 µm; and the diffraction grating layer 30 is formed of n-type InGaAsP and has a carrier concentration of $1 \times 10^{18}$ cm$^{-3}$ and a thickness of 0.05 µm. (n-type, p-type, and i-type (undoped) are hereinafter abbreviated as "n-", "p-", and "i-", respectively.)

The diffraction grating layer 30 includes slits constituting a diffraction grating. An n-InP diffraction grating burying layer 32 having a carrier concentration of $1 \times 10^{18}$ cm$^{-3}$ and a thickness of 0.1 µm is formed so as to fill these slits and cover the surface of the diffraction grating layer 30. On the diffraction grating burying layer 32 is formed an n-AlGaInAs n-side optical confinement layer 34 having a carrier concentration of $1 \times 10^{18}$ cm$^{-3}$ and a thickness of 0.1 µm.

An undoped i-AlGaInAs active layer 36 having a thickness of 0.1 µm is disposed on the n-side optical confinement layer 34. According to the present embodiment, the active layer 36 has a quantum well structure, and the barrier layer is formed of i-AlGaInAs. However, the active layer 36 may be a bulk active layer.

A p-AlGaInAs p-side optical confinement layer 38 having a carrier concentration of $1 \times 10^{18}$ cm$^{-3}$ and a thickness of 0.1 µm is disposed on the active layer 36.

Further, a p-AlGaInAs first p-cladding layer 40 having a carrier concentration of $0.5 \times 10^{18}$ cm$^{-3}$ and a thickness of 0.1 µm is disposed on the p-side optical confinement layer 38.

A second p-cladding layer 42 is formed at the center portion of the width (in the y-direction) of the DFB-LD 10 such that it extends on the first p-cladding layer 40 from the emitting end face 25a to the rear end face 25b in the axial direction of the resonator. Further, the contact layer 22 is disposed on the second p-cladding layer 42, and they constitute the waveguide ridge 12. The second p-cladding layer 42 is formed of p-InP and has a carrier concentration of $1 \times 10^{18}$ cm$^{-3}$ and a thickness of 2.5 µm, while the contact layer 22 is formed of p-InGaAs and has a carrier concentration of $10\times10^{18}$ cm$^{-3}$ and a thickness of 0.5 μm.

According to the present embodiment, the width of the waveguide ridge 12 is larger in a specific portion above the phase shift region of the diffracting grating layer 30 than at the emitting end face 25a and the rear end face 25b, as described later. It should be noted that the phase shift region of the diffraction grating layer 30 is located at the center portion of the length in the axial direction of the resonator and includes a phase shift structure (denoted by reference numeral 30b in FIG. 3).

The surface of the waveguide ridge 12 is covered with the 0.2 μm thick SiO$_2$ film 18, and the opening 17 is formed in the SiO$_2$ film 18 on the top portion of the waveguide ridge 12. The p-electrode 20 is in contact with and electrically connected to the contact layer 22 through the opening 17.

A 1 μm thick metal film formed of, for example, a Ti layer, a Pt layer, and an Au layer is disposed on the underside of the substrate 26 as an n-electrode 44.

In FIG. 3, arrow A represents the laser light, and the direction of arrow A is the emission direction of the light. The diffraction grating layer 30 includes slits 30a formed at predetermined intervals in the axial direction of the resonator or the x-axis direction. These slits 30a are filled with the diffraction grating burying layer 32, so a diffracting grating being formed. Circle B in the figure indicates the phase shift structure 30b located at the center portion of the length in the axial direction of the resonator.

Figure 5:
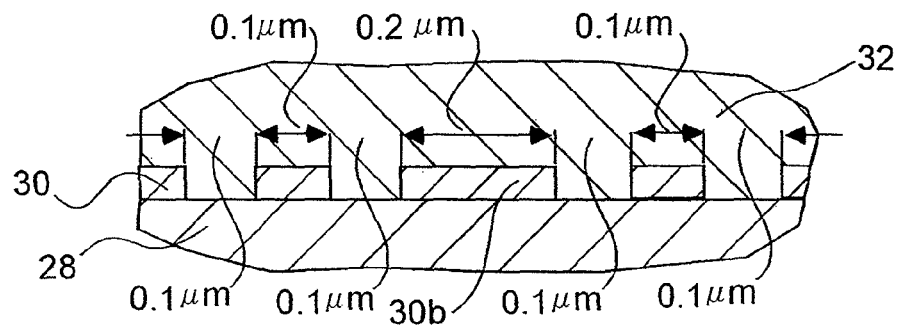
FIG. 5 is a schematic diagram showing cross-sectional dimensions of the diffracting grating of the semiconductor laser according to one embodiment of the present invention.

FIG. 5 is a schematic diagram showing cross-sectional dimensions of the diffracting grating of the semiconductor laser according to one embodiment of the present invention.

Referring to FIG. 5, in the DFB-LD 10 having an oscillation wavelength of 1.3 μm, the dimensions of each regular grating element and each slit 30a of the diffraction grating layer 30 in the axial direction of the resonator or the x-axis direction are 0.1 μm. However, the dimension of the grating element of the phase shift structure of the diffraction grating layer 30 in the axial direction of the resonator is 0.2 μm.

Although, in the DFB-LD 10, the diffraction grating layer 30 and the diffraction grating burying layer 32 are disposed between the n-cladding layer 28 and the n-side optical confinement layer 34 so as to form a diffraction grating, a diffraction grating may be formed between the p-side optical confinement layer 38 and the first p-cladding layer 40.

FIG. 4 is a cross-sectional view of the DFB-LD 10, specifically, the second p-cladding layer 42 taken along a plane parallel to the layers of the waveguide ridge 12, that is, parallel to the main surface of the substrate 26, showing how the width of the waveguide ridge 12 varies in the axial direction of the resonator.

The portion or the center portion of the waveguide ridge 12 that has a larger width than the other portions is located above or corresponds to the phase shift region of the diffraction grating layer 30. This portion of the waveguide ridge 12 includes or constitutes a parallel portion 12a having a width of W1. This parallel portion 12a is defined between the two broken lines in FIG. 4.

The width of the waveguide ridge 12 gradually decreases from one end of the parallel portion 12a toward the emitting end face 25a and from the other end of the parallel portion 12a toward the rear end face 25b. The width of the waveguide ridge 12 at the emitting end face 25a is denoted by W2, and the width of the waveguide ridge 12 at the rear end face is denoted by W3. In the DFB-LD 10 of the present embodiment, the width W1 is 1.8 μm and the widths W2 and W3 are both 1.7 μm.

With the DFB-LD 10 having an oscillation wavelength of 1.3 μm, the maximum allowable value of the width W1 of the portion of the waveguide ridge 12 located above or corresponding to the phase shift region is approximately 1.8 μm, and the minimum allowable values of the widths W2 and W3 of the waveguide ridge 12 at the emitting end face 25a and the rear end face 25b, respectively, are both approximately 1.6 μm.

Thus, the width W1 is set to approximately 1.8 μm or less in order to prevent formation of high-order modes, and the widths W2 and W3 are set to approximately 1.6 μm or more to prevent leakage of light.

These values are only valid when the DFB-LD 10 has an oscillation wavelength of 1.3 μm. If the DFB-LD 10 has a different oscillation wavelength, the maximum and minimum allowable values are determined based on that oscillation wavelength in the same manner as described above.

Figure 6:
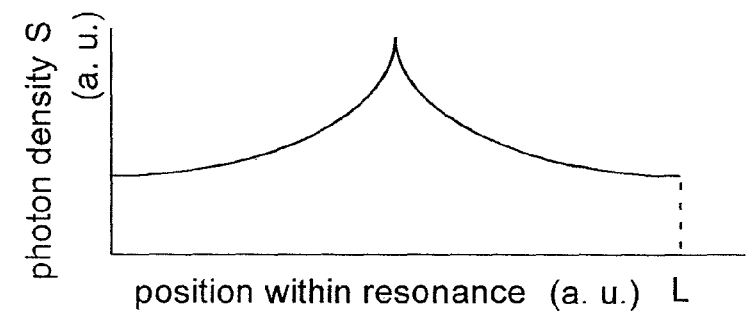
FIG. 6 is a schematic diagram illustrating the photon density distribution within the resonator of the semiconductor laser of one embodiment of the present invention, showing the relationship between the position within the resonator and the photon density.

FIG. 6 is a schematic diagram illustrating the photon density distribution within the resonator of the semiconductor laser of one embodiment of the present invention, showing the relationship between the position within the resonator and the photon density.

In FIG. 6, the vertical axis represents the photon density in arbitrary units (a. u.), and the horizontal axis represents the position within the resonator also expressed in arbitrary units (a. u.). Further, symbol L indicates the resonator length.

Figure 7:
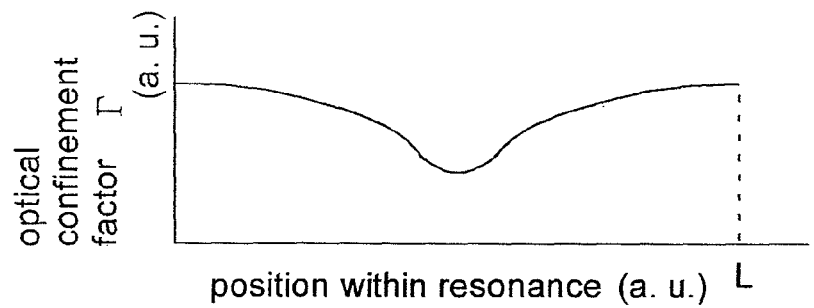
FIG. 7 is a schematic diagram illustrating the optical confinement factor distribution within the resonator of the semiconductor laser of one embodiment of the present invention, showing the relationship between the position within the resonator and the optical confinement factor.

FIG. 7 is a schematic diagram illustrating the optical confinement factor distribution within the resonator of the semiconductor laser of one embodiment of the present invention, showing the relationship between the position within the resonator and the optical confinement factor. In FIG. 7, the vertical axis represents the optical confinement factor in arbitrary units (a. u.), and the horizontal axis represents the position within the resonator also expressed in arbitrary units (a. u.). Further, symbol L indicates the resonator length.

Figure 8:
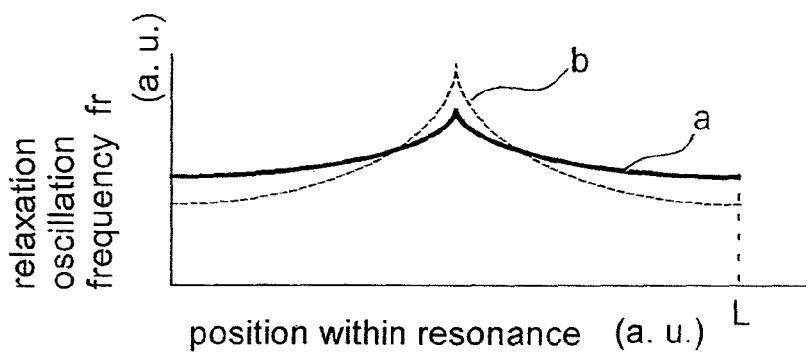
FIG. 8 is a schematic diagram illustrating the relaxation oscillation frequency distribution within the resonator of the semiconductor laser of one embodiment of the present invention, showing the relationship between the position within the resonator and the relaxation oscillation frequency.

FIG. 8 is a schematic diagram illustrating the relaxation oscillation frequency distribution within the resonator of the semiconductor laser of one embodiment of the present invention, showing the relationship between the position within the resonator and the relaxation oscillation frequency. In the figure, the vertical axis represents the relaxation oscillation frequency in arbitrary units (a. u.), and the horizontal axis represents the position within the resonator also expressed in arbitrary units (a. u.). Further, symbol L denotes the resonator length. In FIG. 8, curve a indicates the relaxation oscillation frequency distribution of the DFB-LD 10, that is, the semiconductor laser of the present embodiment, and curve b indicates the relaxation oscillation frequency distribution of a conventional semiconductor laser in which the width of the waveguide ridge does not vary in the axial direction of the resonator, a comparative example.

As shown in FIG. 6, the photon density distribution within the resonator of the DFB-LD 10 is such that the photon density S gradually increases from the emitting end face 25a and the rear end face 25b toward the phase shift region, dramatically increases in a region near the phase shift structure 3b, and then reaches its maximum value in the phase shift structure 3b. This photon density distribution tendency does not change very much either the width of the waveguide ridge is varied in the axial direction of the resonator or not.

In the DFB-LD 10, the width W1 of the portion of the waveguide ridge 12 located above or corresponding to the phase shift region of the diffraction grating layer 30 is larger than those of the other portions. The width of the waveguide ridge 12 gradually decreases from this portion toward the emitting end face 25a and the rear end face 25b. The widths of the waveguide ridge 12 at the emitting end face 25a and at the rear end face 25b are W2 and W3, respectively.

In the case of a waveguide ridge type DFB-LD, the optical confinement factor G can generally be increased by reducing the ridge width. In the DFB-LD 10, the portion of the waveguide ridge 12 located above or corresponding to the phase shift region of the diffraction grating layer 30 has a large width W1, and the width of the waveguide ridge 12 gradually decreases from this portion toward the emitting end face 25a having the width W2 and the rear end face 25b having the width W3. Therefore, as shown in FIG. 7, the optical confinement factor distribution within the resonator is such that the optical confinement factor is high or maximized at the emitting end face 25a and the rear end face 25b, and gradually decreases from these end faces toward the phase shift region, dramatically decreases in a region near the phase shift region, and then gradually decreases to its minimum value in the parallel portion 12a having the width W1.

On the other hand, the relaxation oscillation frequency fr of a semiconductor laser, which represents the high-speed response characteristics of the laser, is proportional to the square root of the product of the photon density S and the optical confinement factor G.

Therefore, in the DFB-LD 10, the relaxation oscillation frequency fr does not vary much with the position within the resonator, as shown in FIG. 8, since a change in the photon density S is cancelled out by a change in the optical confinement factor G.

Specifically, the relaxation oscillation frequencies fr at the emitting end face 25a and the rear end face 25b are increased and the maximum relaxation oscillation frequency fr is reduced, as compared to the conventional semiconductor laser, although the relaxation oscillation frequency still rapidly increases in the phase shift region to some degree.

As a result, the change in the relaxation oscillation frequency in the axial direction of the resonator is reduced, making it possible to reduce the distortion of the modulated light waveform due to a change in the relaxation oscillation frequency or due to non-uniform relaxation oscillation frequency distribution within the resonator when the DFB-LD 10 is subjected to direct modulation operation at high speed.

Figure 9:
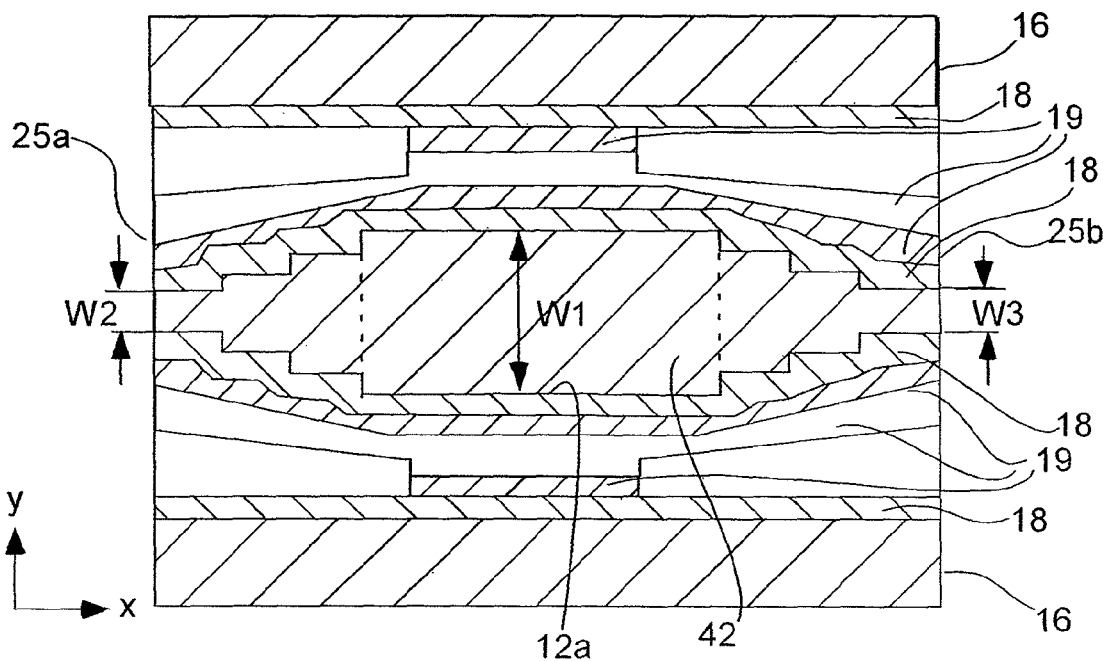
FIG. 9 is a cross-sectional view of a variation of the semiconductor laser according to one embodiment of the present invention.

FIG. 9 is a cross-sectional view of a variation of the semiconductor laser according to one embodiment of the present invention.

Whereas in the DFB-LD 10 shown in FIG. 4 the width of the waveguide ridge 12 is gradually changed, in the DFB-LD shown in FIG. 9 the width of the waveguide ridge 12 is changed stepwise. This can also produce substantially the same effects as described above.

As described above, the waveguide ridge type DFB-LDs 10 according to the present embodiment are configured such that: the second p-cladding layer 42 forms the waveguide ridge 12; and the portion of this waveguide ridge located above or corresponding to the phase shift structure 30b of the diffraction grating layer 30 provided at the center portion of the length of the resonator has a larger width than the end portions of the waveguide ridge. With this arrangement, the change in the photon density within the resonator in the axial direction due to the phase shift structure 30b is cancelled out by the change in the optical confinement factor within the resonator in the axial direction due to a change in the waveguide ridge width, a change in the relaxation oscillation frequency within the resonator in the axial direction being reduced as a result. Therefore, when the waveguide ridge type DFB-LD 10 is subjected to direct modulation operation at high speed, it is possible to reduce the distortion of the modulated light waveform due to a change in the relaxation oscillation frequency or due to non-uniform relaxation oscillation frequency distribution within the resonator.

Second Embodiment

Figure 10:
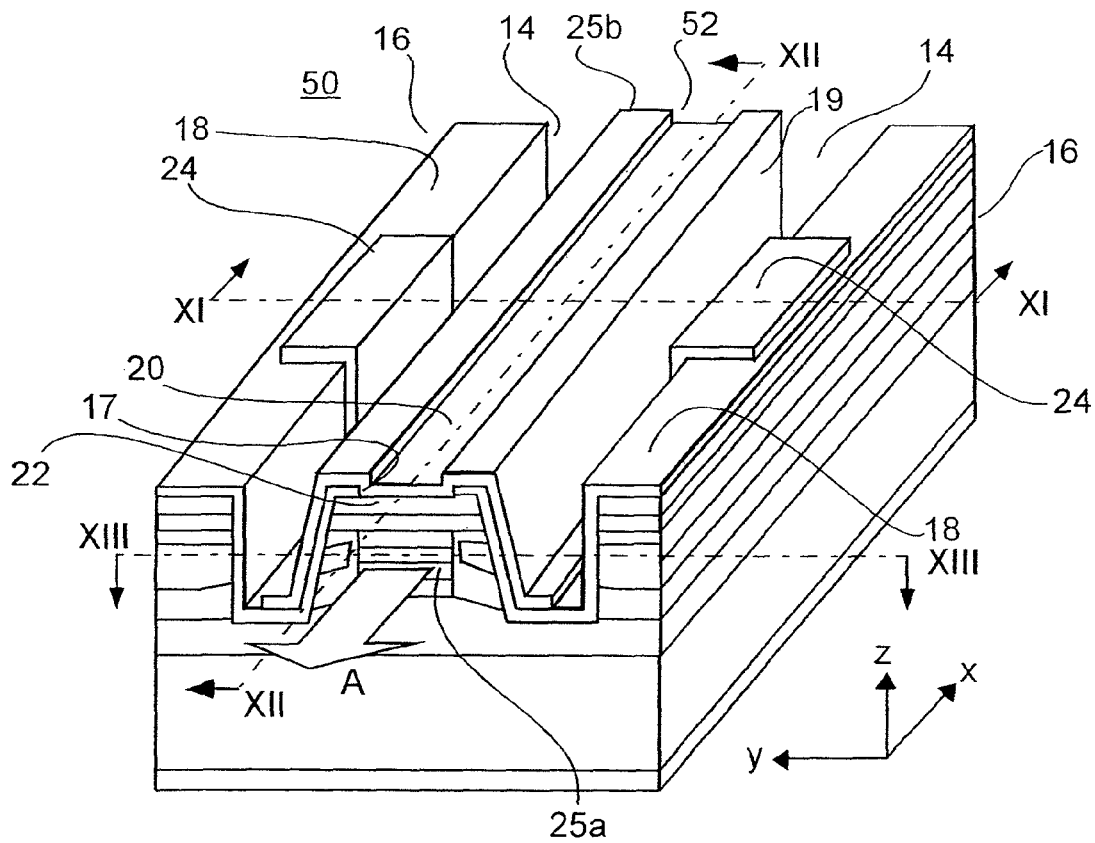
FIG. 10 is a perspective view of a semiconductor laser according to one embodiment of the present invention.
Figure 11:
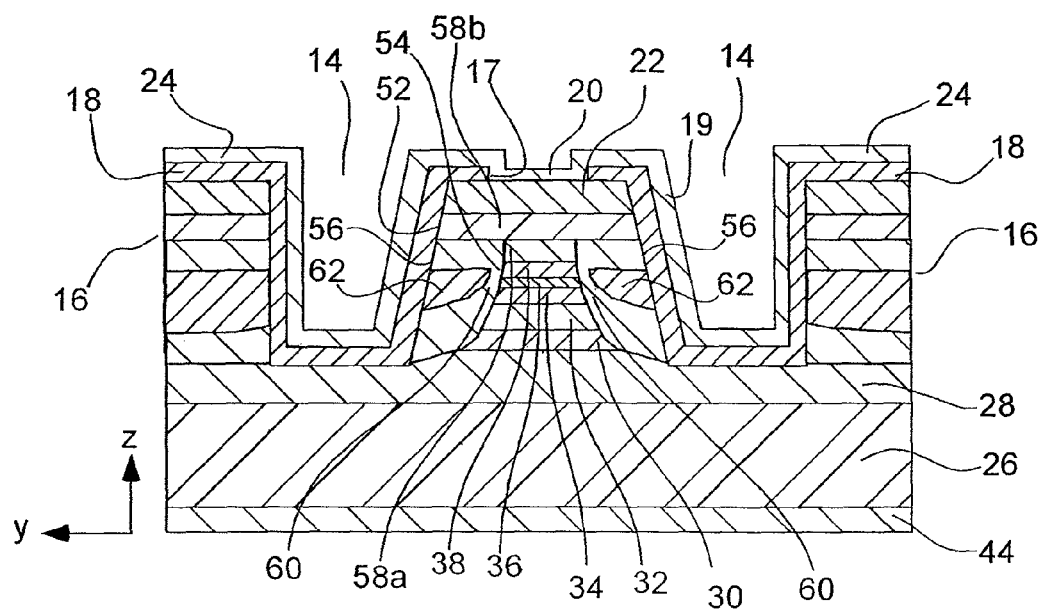
FIG. 11 is a cross-sectional view of the semiconductor laser taken along line XI-XI of FIG. 10.
Figure 12:
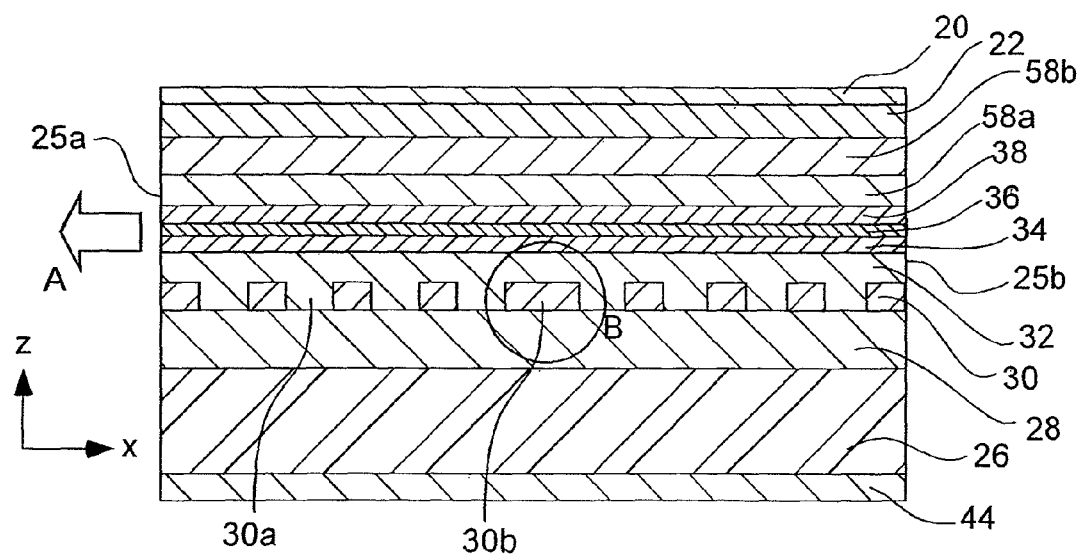
FIG. 12 is a cross-sectional view of the semiconductor laser taken along line XII-XII of FIG. 10
Figure 13:
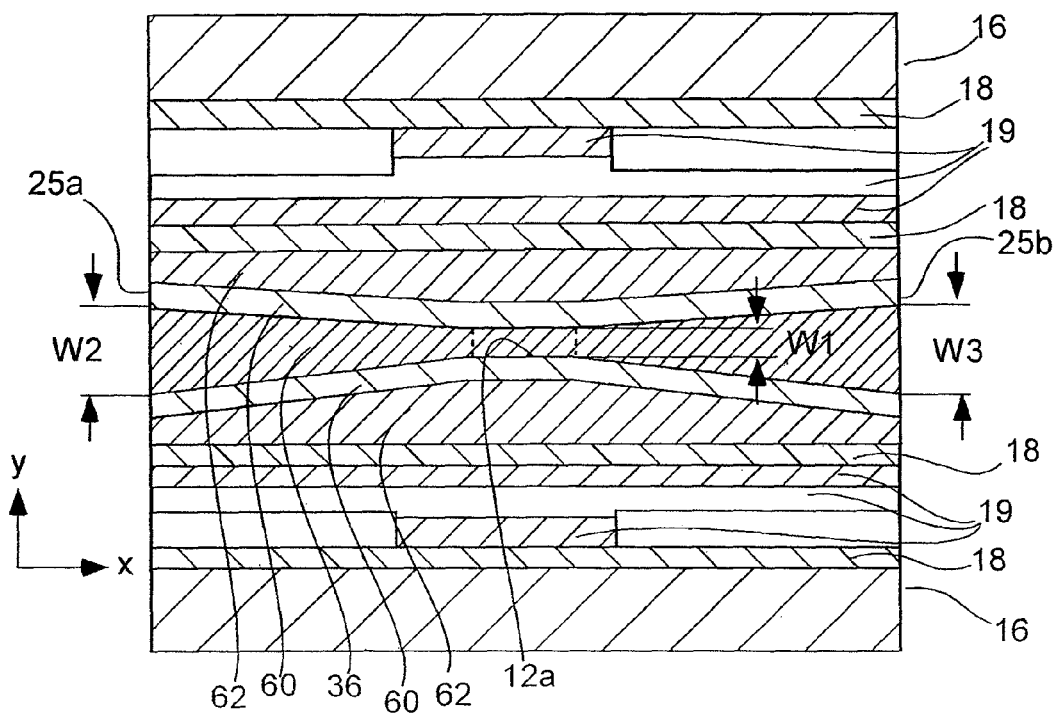
FIG. 13 is a cross-sectional view of the semiconductor laser taken along line XIII-XIII of FIG. 10.

FIG. 10 is a perspective view of a semiconductor laser according to one embodiment of the present invention; FIG. 11 is a cross-sectional view of the semiconductor laser taken along line XI-XI of FIG. 10; FIG. 12 is a cross-sectional view of the semiconductor laser taken along line XII-XII of FIG. 10; and FIG. 13 is a cross-sectional view of the semiconductor laser taken along line XIII-XIII of FIG. 10.

Referring to FIG. 10, the semiconductor laser of the second embodiment of the present invention is a buried heterostructure DFB-LD 50 having an oscillation wavelength of 1.3 μm and a resonator length L of approximately 100-250 μm, for example.

A buried heterostructure 52 at the center portion of the DFB-LD 50 extends in the laser light emission direction. In FIG. 10, arrow A represents the laser light, and the direction of arrow A is the emission direction of the light. Two electrode pad bases 16 are disposed on respective sides of the buried heterostructure 52. A separate groove 14 is disposed between each electrode pad base 16 and the buried heterostructure 52. An insulating film, for example, an $SiO_2$ film 18 is disposed on the entire surface of the DFB-LD 50 other than the surfaces of an opening 17 provided at the center of the top portion of the buried heterostructure 52. The opening 17 is formed at the center of the top portion of the buried heterostructure 52 such that it extends in the axial direction of the resonator, or the x-axis direction.

A metal film 19 is formed on the portion of the $SiO_2$ film 18 on the buried heterostructure 52. At the top portion of the buried heterostructure 52, the metal film 19 is in contact with a contact layer 22 or the top layer of the buried heterostructure 52 through the opening 17 as a p-electrode 20. A portion of the metal film 19 extends onto the electrode pad bases 16 on both sides of the buried heterostructure 52. The above extended portion on the $SiO_2$ film 18 on each electrode pad base 16 constitutes a bonding pad 24 for the p-electrode 20.

In FIG. 10, reference numeral 25a denotes the emitting end face of the DFB-LD 50 through which the laser light indicated by arrow A is emitted, and reference numeral 25b denotes the rear end face on the side opposite to the emitting end face 25a.

Referring now to FIG. 11, in the DFB-LD 50, an n-cladding layer 28 is disposed on a substrate 26. The substrate 26 is formed of n-type InP and has a carrier concentration of $5 \times 10^{18}$ cm$^{-3}$ and a thickness of 100 μm; and the n-cladding layer 28 is formed of n-InP and has a carrier concentration of $1 \times 10^{18}$ cm$^{-3}$ and a thickness of 2 μm.

The buried heterostructure 52 is formed at the center portion of the width (in the y-direction) of the DFB-LD 50 such that it extends on the n-cladding layer 28 from the emitting end face 25a to the rear end face 25b in the axial direction of the resonator.

The buried heterostructure 52 includes: a mesa 54 located at the center; a burying portion 56 disposed on both sides of the mesa 54 such that the mesa 54 is buried in the burying portion 56; a second p-cladding layer 58b disposed on the mesa 54 and the burying portion 56; and a contact layer 22 disposed on the second p-cladding layer 58b.

The mesa 54 includes: an n-InGaAsP diffraction grating layer 30 disposed on the n-cladding layer 28 and having a carrier concentration of $1 \times 10^{18}$ cm$^{-3}$ and a thickness of 0.02 μm; an n-InP diffraction grating burying layer 32 filling and covering the diffraction grating layer 30 and having a carrier concentration of $1 \times 10^{18}$ cm$^{-3}$ and a thickness of 0.2 μm; an n-AlGaInAs n-side optical confinement layer 34 disposed on the diffraction grating burying layer 32 and having a carrier concentration of $1\times10^{18}$ cm$^3$ and a thickness of 0.1 µm; an undoped i-AlGaInAs active layer 36 disposed on the n-side optical confinement layer 34 and having a thickness of 0.1 µm; a p-AlGaInAs p-side optical confinement layer 38 disposed on the active layer 36 and having a carrier concentration of $1\times10^{18}$ cm$^{-3}$ and a thickness of 0.1 µm; and a p-InP first p-cladding layer 58a disposed on the p-side optical confinement layer 38 and having a carrier concentration of $1\times10^{18}$ cm$^{-3}$ and a thickness of 0.5 µm.

The burying portion 56 includes: a p-InP burying layer 60 disposed in contact with the sides of the mesa 54 and having a carrier concentration of $2\times10^{18}$ cm$^{-3}$ and a thickness of 0.5 µm at the sides of the mesa 54; and an n-InP current blocking layer 62 defining the thickness of the p-InP burying layer 60 at the sides of the mesa 54 and having a carrier concentration of $5\times10^{18}$ cm$^{-3}$ and a thickness of 2 µm.

The second p-cladding layer 58b is formed of the same material as the first p-cladding layer 58a and has a thickness of 2 µm, and the contact layer 22 is formed of p-InGaAs and has a carrier concentration of $10\times10^{18}$ cm$^{-3}$ and a thickness of 0.5 µm.

According to the second embodiment, the width of the mesa 54 is smaller in a specific portion located above or corresponding to the phase shift region of the diffraction grating layer 30 than at the emitting end face 25a and the rear end face 25b, as described later. The phase shift region is located at the center portion of the length of the resonator and includes a phase shift structure (denoted by reference numeral 30b in FIG. 12).

In the etching process for forming the mesa 54, a selective etching mask pattern may be formed which has a width varying in the axial direction of the resonator.

The surface of the buried heterostructure 52 is covered with the SiO$_2$ film 18, and the opening 17 is formed in the SiO$_2$ film 18 on the top portion of the buried heterostructure 52. The p-electrode 20 is in contact with and electrically connected to the contact layer 22 through the opening 17. An n-electrode 44 is disposed on the underside of the substrate 26.

In FIG. 12, arrow A represents the laser light, and the direction of arrow A is the emission direction of the light. The diffraction grating layer 30 includes slits 30a formed at predetermined intervals in the axial direction of the resonator or the x-axis direction. These slits 30a are filled with the diffraction grating burying layer 32, forming a diffraction grating. In the figure, circle B indicates the phase shift structure 30b located at the center portion of the length in the axial direction of the resonator. The diffracting grating has the same cross-sectional dimensions as the diffraction grating of the first embodiment described with reference to FIG. 5.

FIG. 13 is a cross-sectional view of the DFB-LD 50, specifically, the active layer 36 taken along a plane parallel to the layers of the buried heterostructure 52, that is, parallel to the main surface of the substrate 26, showing how the width of the mesa 54 varies in the axial direction of the resonator.

The portion or the center portion of the mesa 54 that has a smaller width than the other portions is located above or corresponds to the phase shift region of the diffraction grating layer 30. This portion of the mesa 54 includes or constitutes a parallel portion 12a having a width of W1. This parallel portion 12a is defined between the two broken lines in FIG. 13.

The width of the mesa 54 gradually increases from one end of parallel portion 12a toward the emitting end face 25 and from the other end of the parallel portion 12a toward the rear end face 25b. The widths of the mesa 54 at the emitting end face 25a and at the rear end face 25b are W2 and W3, respectively. In the DFB-LD 50 of the present embodiment, the width W1 is 0.4 µm and the widths W2 and W3 are both 1.5 µm.

With the DFB-LD 50 having an oscillation wavelength of 1.3 µm, the minimum allowable value of the width W1 of the portion of the mesa 54 located above or corresponding to the phase shift region is approximately 0.4 µm, and the maximum allowable values of the widths W2 and W3 of the mesa 54 at the emitting end face 25a and the rear end face 25b, respectively, are both approximately 1.8 µm.

Thus, the width W1 is set to approximately 0.4 µm or more in order to prevent oscillation and facilitate manufacture of the device, and the widths W2 and W3 are set to approximately 1.8 µm or less to prevent formation of high-order modes.

These values are only valid when the DFB-LD 50 has an oscillation wavelength of 1.3 µm. If the DFB-LD 50 has a different oscillation wavelength, the maximum and minimum allowable values are determined based on that oscillation wavelength in the same manner as the first embodiment.

As shown in FIG. 6 described in connection with the first embodiment, the photon density distribution within the resonator of the DFB-LD 50 is such that the photon density S gradually increases from the emitting end face 25a and the rear end face 25b toward the phase shift region, dramatically increases in a region near the phase shift structure 3b, and then reaches its maximum value in the phase shift structure 3b.

In the DFB-LD 50, the width W1 of the portion of the mesa 54 located above or corresponding to the phase shift region of the diffraction grating layer 30 is smaller than the widths of the other portions. Specifically, the width of the mesa 54 gradually increases from this portion toward the emitting end face 25a and the rear end face 25b. The widths of the mesa 54 at the emitting end face 25a and at the rear end face 52b are W2 and W3, respectively.

In the case of a buried heterostructure DFB-LD, the optical confinement factor G can generally be increased by increasing the ridge width. In the DFB-LD 50, the portion of the mesa 54 located above or corresponding to the phase shift region of the diffraction grating layer 30 has a small width (W1), and the width of the mesa 54 gradually increases from this portion toward the emitting end face 25a having the width W2 and the rear end face 25b having the width W3. Therefore, as shown in FIG. 7 described in connection with the first embodiment, the optical confinement factor distribution within the resonator is such that the optical confinement factor G is high or maximized at the emitting end face 25a and the rear end face 25b, and gradually decreases from these end faces toward the phase shift region, dramatically decreases in a region near the phase shift region, and then gradually decreases to its minimum value in the parallel portion 12a having the width W1.

On the other hand, the relaxation oscillation frequency fr of a semiconductor laser, which represents the high-speed response characteristics of the laser, is proportional to the square root of the product of the photon density S and the optical confinement factor G.

Therefore, in the DFB-LD 50, the relaxation oscillation frequency fr does not vary much with the position within the resonator, as shown in FIG. 8 described in connection with the first embodiment, since a change in the photon density S is cancelled out by a change in the optical confinement factor G.

Specifically, the relaxation oscillation frequencies fr at the emitting end face 25a and the rear end face 25b are increased and the maximum relaxation oscillation frequency fr is reduced, as compared to a conventional semiconductor laser, although the relaxation oscillation frequency still rapidly increases in the phase shift region to some degree. As a result, the change in the relaxation oscillation frequency in the axial direction of the resonator is reduced, making it possible to reduce the distortion of the modulated light waveform due to a change in the relaxation oscillation frequency or due to non-uniform relaxation oscillation frequency distribution within the resonator when the DFB-LD 50 is subjected to direct modulation operation at high speed.

Figure 14:
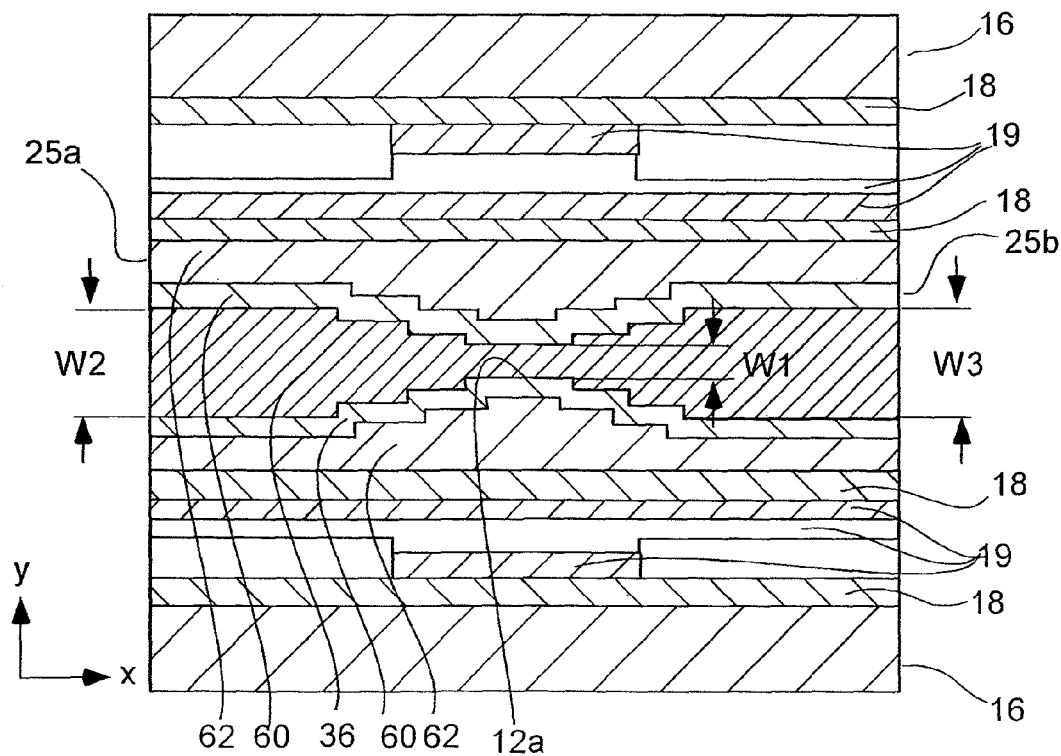
FIG. 14 is a cross-sectional view of a variation of the semiconductor laser according to one embodiment of the present invention.

FIG. 14 is a cross-sectional view of a variation of the semiconductor laser according to one embodiment of the present invention.

Whereas in the DFB-LD 50 shown in FIG. 13 the width of the mesa 54 is gradually changed, in the DFB-LD 50 shown in FIG. 14 the width of the mesa 54 is changed stepwise. This can also produce substantially the same effects as described above.

As described above, the buried heterostructure DFB-LDs 50 of the second embodiment are configured such that: a heterojunction is formed in the mesa 54 including the active layer 36; the mesa 54 is buried in the burying portion 56 disposed on both sides of the mesa 54; and the portion of the mesa 54 located above or corresponding to the phase shift structure 30*b* of the diffraction grating layer 30 provided at the center portion of the length of the resonator has a smaller width than the end portions of the mesa 54. With this arrangement, the change in the photon density within the resonator in the axial direction due to the phase shift structure 30*b* is cancelled out by the change in the optical confinement factor within the resonator in the axial direction due to a change in the mesa width, a change in the relaxation oscillation frequency within the resonator in the axial direction being reduced as a result. Therefore, when the buried heterostructure DFB-LD is subjected to direct modulation operation at high speed, it is possible to reduce the distortion of the modulated light waveform due to a change in the relaxation oscillation frequency or due to non-uniform relaxation oscillation frequency distribution within the resonator.

As described above, a semiconductor laser according to the present invention comprises: a semiconductor substrate of a first conductive type; a first cladding layer of the first conductive type located on the semiconductor substrate; an active layer located on the first cladding layer; a second cladding layer of a second conductive type located on the active layer; and a diffraction grating layer located between the active layer and the first or second cladding layer and including a phase shift structure which is formed in a part of the diffraction grating layer in an optical waveguide direction, wherein an optical confinement factor is reduced in corresponding to the phase shift structure of the diffraction grating layer. This arrangement allows the product of the photon density and the optical confinement factor in the specific portion in corresponding to the phase shift structure to be substantially equal to that in the other portions, resulting in the relaxation oscillation frequency in the specific portion being substantially equal to the relaxation oscillation frequency in the other portions. This means that the relaxation oscillation frequency does not vary much in the axial direction of the resonator, preventing distortion of the modulated light waveform and allowing the semiconductor laser to achieve good high-speed response characteristics.

Third Embodiment

Figure 15:
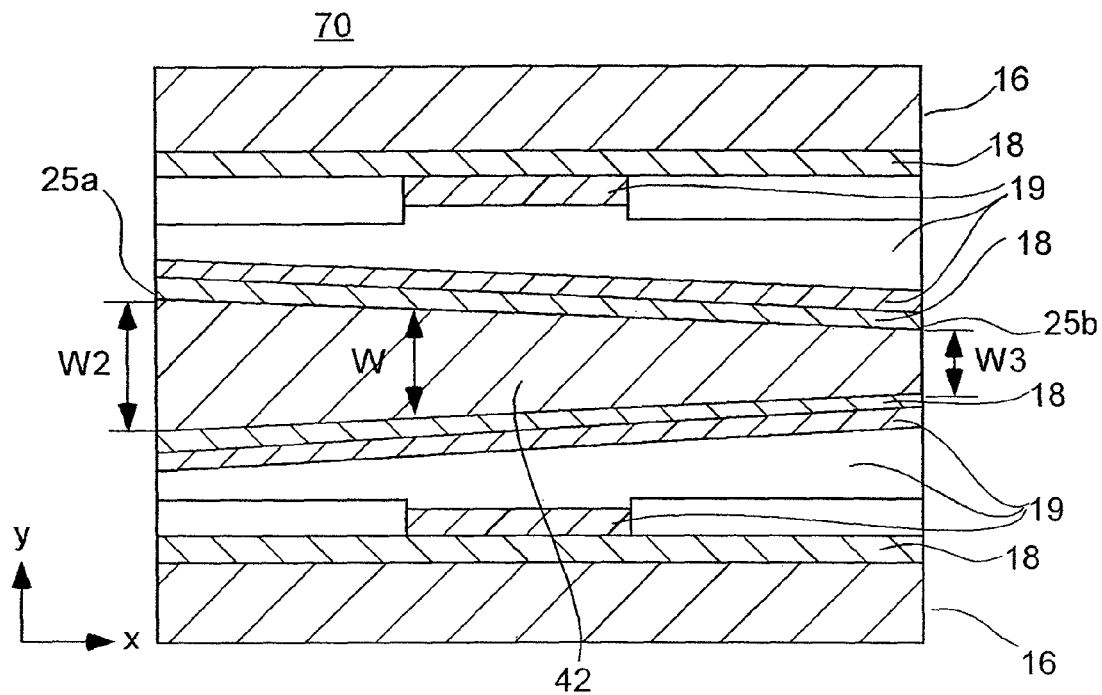
FIG. 15 is a cross-sectional view of a semiconductor laser according to one embodiment of the present invention.

FIG. 15 is a cross-sectional view of a semiconductor laser according to one embodiment of the present invention.

The semiconductor laser shown in FIG. 15 is a waveguide ridge type DFB-LD 70 similar to the DFB-LD 10 of the first embodiment. Specifically, the DFB-LD 70 has the same configuration as the DFB-LD 10 except that the diffraction grating layer 30 of the DFB-LD 70 does not include the phase shift structure 30*b*. Therefore, a cross-sectional view of the DFB-LD 70 taken along a plane perpendicular to the resonator axis is similar to the cross-sectional view shown in FIG. 2.

Further, the cross-sectional view of the DFB-LD 70, specifically, the second p-cladding layer 42 shown in FIG. 15 corresponds to that shown in FIG. 4 and is taken along a plane parallel to the layers of the waveguide ridge 12, that is, parallel to the main surface of the substrate 26, showing how the width of the waveguide ridge 12 vary in the axial direction of the resonator.

In the DFB-LD 70, the diffraction grating layer 30 does not include the phase shift structure 30*b*, and the emitting end face 25*a* has a lower reflectance than the rear end face 25*b*. As a result, the photon density distribution within the resonator of the DFB-LD 70 is such that the photon density gradually decreases from the emitting end face 25*a* to the rear end face 25*b*. Therefore, the DFB-LD 70 is further configured such that: the width of the waveguide ridge 12 is largest at the emitting end face 52*a* and smallest at the rear end face 52*b*; and the width of the waveguide ridge 12 linearly decreases from the emitting end face 52*a* to the rear end face 52*b*. This causes an optical confinement factor distribution to be formed within the resonator such that the optical confinement factor G is highest at the rear end face 25*b* and gradually decreases toward the emitting end face 25*a*.

On the other hand, the relaxation oscillation frequency fr of a semiconductor laser, which represents the high-speed response characteristics of the laser, is proportional to the square root of the product of the photon density S and the optical confinement factor G. Therefore, the relaxation oscillation frequency distribution within the resonator of the DFB-LD 70 is such that the relaxation oscillation frequency does not vary much with the position within the resonator, since a change in the photon density S is cancelled out by a change in the optical confinement factor G.

Specifically, the relaxation oscillation frequency fr is increased at the rear end face 25*b* and decreased at the emitting end face 25*a* as compared to when the waveguide ridge has a constant width, thus reducing the change in the relaxation oscillation frequency in the axial direction of the resonator. Therefore, when the DFB-LD 70 is subjected to direct modulation operation at high speed, it is possible to reduce the distortion of the modulated light waveform due to a change in the relaxation oscillation frequency or due to non-uniform relaxation oscillation frequency distribution within the resonator.

As described above, a semiconductor laser according to the present embodiment comprises: a semiconductor substrate of a first conductive type; a first cladding layer of the first conductive type located on the semiconductor substrate; an active layer located on the first cladding layer; a second cladding layer of a second conductive type located on the active layer; a diffraction grating layer located between the active layer and the first or second cladding layer; and an optical waveguide ridge including the a second cladding layer, wherein the waveguide ridge is larger in the width at one end having a higher photon density in an optical waveguide direction than at the other end. This arrangement reduces the change in the relaxation oscillation frequency within the resonator in the axial direction. Therefore, when the semiconductor laser is subjected to direct modulation operation at high speed, it is possible to reduce the distortion of the modulated light waveform due to a change in the relaxation oscillation frequency or due to non-uniform relaxation oscillation frequency distribution within the resonator.

Fourth Embodiment

Figure 16:
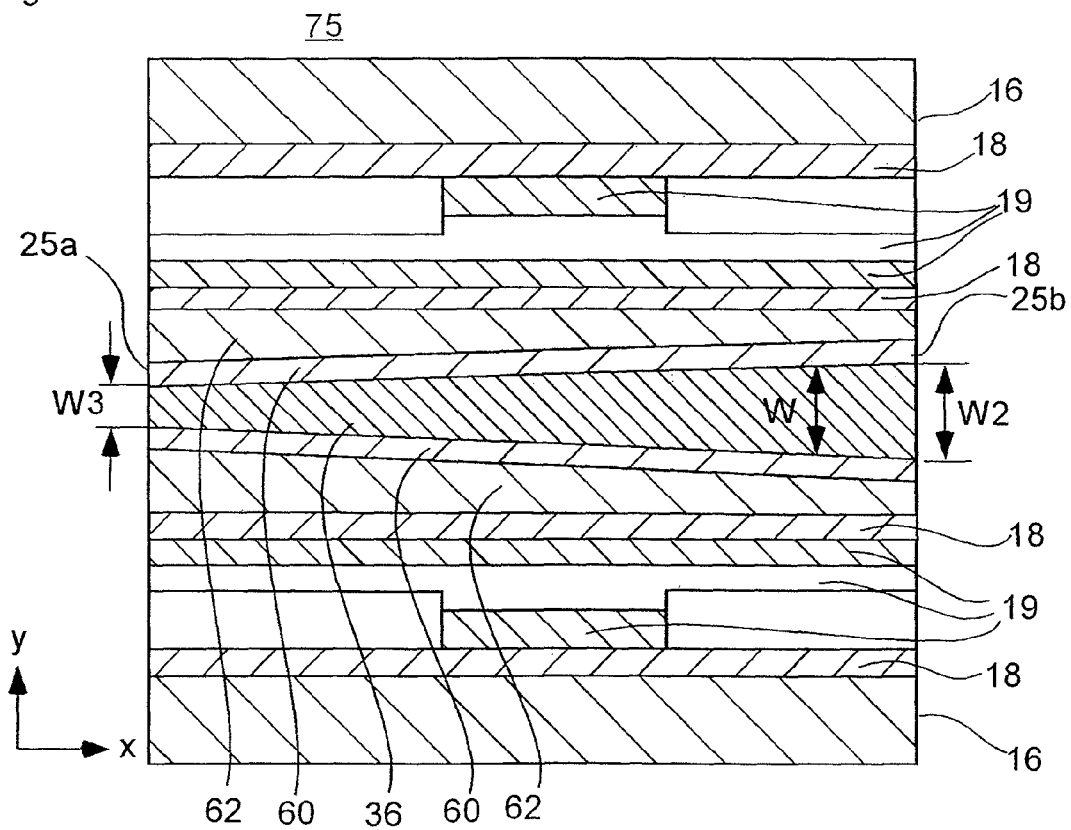
FIG. 16 is a cross-sectional view of a semiconductor laser according to a fourth embodiment of the present invention.

FIG. 16 is a cross-sectional view of a semiconductor laser according to a fourth embodiment of the present invention.

The semiconductor laser shown in FIG. 16 is a buried heterostructure DFB-LD 75 similar to the DFB-LD 50 of the second embodiment. Specifically, the DFB-LD 75 has the same configuration as the DFB-LD 50 except that the diffraction grating layer 30 of the DFB-LD 75 does not include the phase shift structure 30b. Therefore, a perspective view of the DFB-LD 75 is similar to the perspective view shown in FIG. 10 described in connection with the second embodiment. Further, a cross-sectional view of the DFB-LD 75 taken along a plane perpendicular to the resonator axis is similar to the cross-sectional view shown in FIG. 11 described in connection with the second embodiment.

Further, the cross-sectional view of the DFB-LD 75, specifically, the active layer 36 shown in FIG. 16 corresponds to that shown in FIG. 13 and is taken along a plane parallel to the layers of the buried heterostructure 52, that is, parallel to the main surface of the substrate 26, showing how the width of the mesa 54 varies in the axial direction of the resonator.

In the DFB-LD 75, the diffraction grating layer 30 does not include the phase shift structure 30b, and the emitting end face 25a has a lower reflectance than the rear end face 25b. As a result, the photon density distribution within the resonator of the DFB-LD 75 is such that the photon density gradually decreases from the emitting end face 25a to the rear end face 25b.

Therefore, the DFB-LD 75 is further configured such that: the width of the mesa 54 is smallest at the emitting face 52a and largest at the rear end face 52b; and the width of the mesa 54 linearly decreases from the rear end face 25b to the emitting end face 52a. This causes an optical confinement factor distribution to be formed within the resonator such that the optical confinement factor G is highest at the rear end face 25b and gradually decreases toward the emitting end face 25a.

On the other hand, the relaxation oscillation frequency fr of a semiconductor laser, which represents the high-speed response characteristics of the laser, is proportional to the square root of the product of the photon density S and the optical confinement factor G. Therefore, the relaxation oscillation frequency distribution within the resonator of the DFB-LD 75 is such that the relaxation oscillation frequency does not vary much with the position within the resonator, since a change in the photon density S is cancelled out by a change in the optical confinement factor.

Specifically, the relaxation oscillation frequency fr is increased at the rear end face 25b and decreased at the emitting end face 25a as compared to when the mesa has a constant width, thus reducing the change in the relaxation oscillation frequency in the axial direction of the resonator. Therefore, when the DFB-LD 75 is subjected to direct modulation operation at high speed, it is possible to reduce the distortion of the modulated light waveform due to a change in the relaxation oscillation frequency or due to non-uniform relaxation oscillation frequency distribution within the resonator.

In the semiconductor laser of each embodiment described above, the width of a waveguide ridge or a mesa including an active layer and a heterojunction is varied to vary the optical confinement factor according to the position within the resonator in the axial direction. However, the thickness of at least one of the layers that are disposed between an n-side cladding layer and a p-side cladding layer and that have a higher refractive index than the n-side or p-side cladding layer, that is, an active layer, a barrier layer, optical confinement layers, etc. may be varied in the optical waveguide direction such that it is reduced in a specific portion adjacent or corresponding to a relatively high photon density region. This can also produce the same effects as described above.

Reducing the thickness of these high refractive index layers results in a reduction in the optical confinement factor, making it possible to prevent the relaxation oscillation frequency from varying in the axial direction of the resonator. Therefore, when the DFB-LD 75 is subjected to direct modulation operation at high speed, it is possible to reduce the distortion of the modulated light waveform due to a change in the relaxation oscillation frequency or due to non-uniform relaxation oscillation frequency distribution within the resonator.

The thicknesses of the above high refractive index layers may be varied by an MOCVD device using a selective growth technique.

Fifth Embodiment

Figure 17:
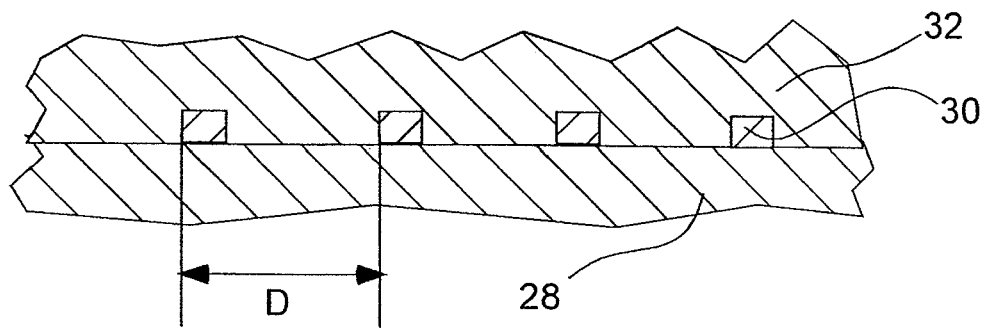
FIG. 17 is a schematic diagram showing a pitch of a diffraction grating according to one embodiment of the present invention.

FIG. 17 is a schematic diagram showing a pitch of a diffraction grating according to one embodiment of the present invention.

Figure 18:
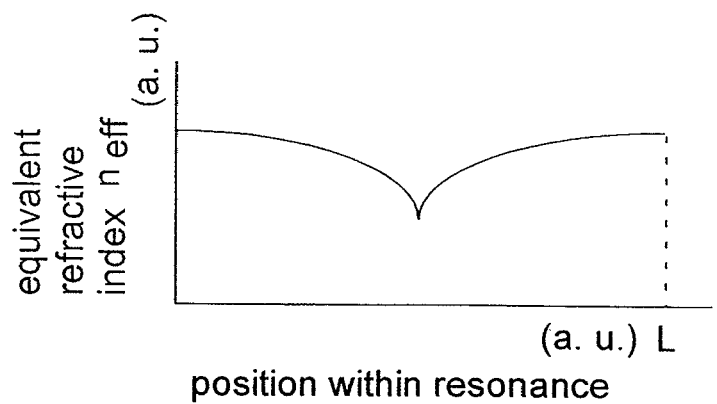
FIG. 18 is a schematic diagram showing the relationship between the position within a resonator and the equivalent refractive index according to one embodiment of the present invention.

FIG. 18 is a schematic diagram showing the relationship between the position within a resonator and the equivalent refractive index according to one embodiment of the present invention.

Figure 19:
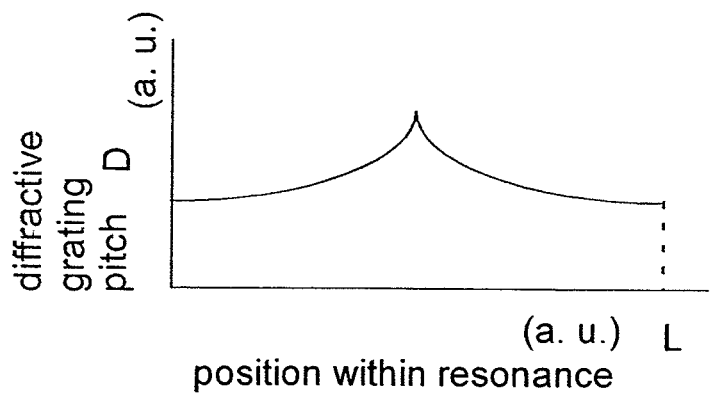
FIG. 19 is a schematic diagram showing the diffraction grating pitch distribution within the resonator according to one embodiment of the present invention.

FIG. 19 is a schematic diagram showing the diffraction grating pitch distribution within the resonator according to one embodiment of the present invention.

This embodiment is applied to the DFB-LDs of the first and second embodiments. The oscillation wavelength λ of each DFB-LD is proportional to the product of the diffraction grating pitch D and the equivalent refractive index $n_{\textit{eff}}$, and, generally, the equivalent refractive index $n_{\textit{eff}}$ decreases with decreasing optical confinement factor of the active layer.

As shown in FIG. 18, in these DFB-LDs in which the diffraction grating includes a phase shift structure, the equivalent refractive index dramatically decreases to its minimum value in the phase shift region.

Since the oscillation wavelength λ is proportional to the product of the diffraction grating pitch D and the equivalent refractive index $n_{\textit{eff}}$, a large change in the equivalent refractive index $n_{\textit{eff}}$ with the position within the resonator results in a change in the oscillation wavelength λ.

Therefore, in the DFB-LD according to the present embodiment, the pitch D of the diffraction grating is not fixed, but varied with the position within the resonator such that the product of the pitch D and the equivalent refractive index $n_{\textit{eff}}$ is substantially constant with the position within the resonator. That is, if the equivalent refractive index $n_{\textit{eff}}$ varies with the position within the resonator as shown in FIG. 18, the diffraction grating of the DFB-LD is formed such that the grating pitch varies with the position within the resonator as shown in FIG. 19.

This allows the DFB-LD to emit laser light with a narrow spectral width predominantly including the desired oscillation wavelength.

A manufacturing method for varying the pitch of the diffraction grating according to the position within the resonator in the axial direction is to use EB (Electron Beam) lithography to form a diffraction grating forming pattern used in a conventional semiconductor laser.

As described above, a semiconductor laser according to the present invention comprises: a semiconductor substrate of a first conductive type; a first cladding layer of the first conductive type located on the semiconductor substrate; an active layer located on the first cladding layer; a second cladding layer of a second conductive type located on the active layer;

and a diffraction grating layer located between the active layer and said first or second cladding layer, wherein the pitch of the diffraction grating layer is varied in an axial direction of the resonator such that the product of the pitch and an equivalent refractive index is substantially constant in the axial direction, the equivalent refractive index being determined by the refractive index of each layer. This arrangement reduces a variation in the oscillation wavelength $\lambda$, allowing the semiconductor laser to emit laser light with a narrow spectral width predominantly including the desired oscillation wavelength.

It should be noted that although the above embodiments have been described as using AlGaInAs as a material for the active layer, other materials may be used, such as InGaAsP, InGaAs, InGaP, InGaNAs, and InGaAsSb.

As described above, the semiconductor lasers according to the present invention are especially suitable for use as light sources for optical fiber communications.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser comprising:
a semiconductor substrate of a first conductivity type;
a first cladding layer of the first conductivity type located on said semiconductor substrate;
an active layer located on said first cladding layer;
a second cladding layer of a second conductivity type located on said active layer;
a diffraction grating layer located between said active layer and one of said first and second cladding layers; and
a layer having a higher refractive index than said first cladding layer or said second cladding layer and located between said first and second cladding layers, reduced in thickness at a first end having a higher photon density, in an optical waveguide direction, than at a second end, the optical waveguide direction extending along an optical axis of said semiconductor laser from a first end of said semiconductor laser to the second end of said semiconductor laser.

* * * * *